(12) United States Patent
Chen et al.

(10) Patent No.: US 8,120,148 B2
(45) Date of Patent: Feb. 21, 2012

(54) PACKAGE STRUCTURE WITH EMBEDDED DIE AND METHOD OF FABRICATING THE SAME

(75) Inventors: Kuo-Hua Chen, Penghu County (TW); Ying-Te Ou, Kaohsiung (TW); Chieh-Chen Fu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 897 days.

(21) Appl. No.: 12/143,183

(22) Filed: Jun. 20, 2008

(65) Prior Publication Data

US 2009/0224378 A1 Sep. 10, 2009

(30) Foreign Application Priority Data

Mar. 4, 2008 (TW) .............................. 97107502 A (51) Int. Cl.
*H01L 23/495* (2006.01)
(52) U.S. Cl. ........... 257/666; 257/E21.51; 257/E23.031; 438/123
(58) Field of Classification Search .................. 257/666, 257/E21.51, E23.031
See application file for complete search history.

(56) References Cited

U.S. PATENT DOCUMENTS

| | | | |
|---|---|---|---|
| 7,732,712 B2 * | 6/2010 | Yamano | 174/260 |
| 7,923,295 B2 * | 4/2011 | Shim et al. | 438/109 |
| 2004/0262735 A1 * | 12/2004 | Higashi et al. | 257/686 |
| 2006/0208356 A1 * | 9/2006 | Yamano et al. | 257/734 |
| 2008/0145975 A1 * | 6/2008 | Hsu et al. | 438/123 |
| 2009/0224378 A1 * | 9/2009 | Chen et al. | 257/666 |
| 2011/0037154 A1 * | 2/2011 | Shim et al. | 257/676 |

\* cited by examiner

*Primary Examiner* — Benjamin Sandvik
*Assistant Examiner* — Krista Soderholm
(74) *Attorney, Agent, or Firm* — J.C. Patents (57) ABSTRACT

A package structure with an embedded die includes a core layer, a first build-up wiring structure, and a second build-up wiring structure. The core layer has a first surface and a second surface opposite thereto. Besides, the core layer includes a first dielectric layer, a leadframe, a die, a first signal layer, and a second signal layer. The die is disposed on and electrically connected to the leadframe. The die and the leadframe are embedded in the first dielectric layer. The first signal layer is disposed on an upper surface of the first dielectric layer and electrically connected to the leadframe. The second signal layer is disposed on a bottom surface of the first dielectric layer and electrically connected to the leadframe. The first and the second build-up wiring structures are disposed on the first and the second surfaces of the core layer, respectively.

20 Claims, 6 Drawing Sheets

PACKAGE STRUCTURE WITH EMBEDDED DIE AND METHOD OF FABRICATING THE SAME

CROSS-REFERENCE TO RELATED APPLICATION

This application claims the priority benefit of Taiwan application serial no. 97107502, filed on Mar. 4, 2008. The entirety of the above-mentioned patent application is hereby incorporated by reference herein and made a part of specification.

BACKGROUND OF THE INVENTION

1. Field of the Invention

The present invention relates to a chip package structure and a method of fabricating the same. More particularly, the present invention relates to a package structure with an embedded die and a method of fabricating said package structure.

2. Description of Related Art

Generally, a circuit substrate mainly comprises multiple patterned circuit layers and dielectric layers which are alternately stacked on one another. The patterned circuit layers are made of, for example, copper foils which are defined by a photolithography process and an etching process. The dielectric layers are disposed between the patterned circuit layers to isolate the patterned circuit layers. In addition, the stacked patterned circuit layers are electrically connected together through plating through holes (PTHs) or conductive vias penetrating the dielectric layers. Finally, various electronic devices (such as active or passive devices) are disposed on the surface of the circuit substrate, and electrical signal propagation is achieved by means of the circuit design of internal circuits.

However, in order to satisfy the requirements of light weight, compactness, and portability of the electronic products in the market, the electronic devices originally welded onto the surface of the circuit substrate are now designed as embedded components in the circuit substrate, so as to increase a wiring area on the surface of the circuit substrate and miniaturize the electronic products. Conventionally, holes should be first formed on the substrate, such that dies can be placed in the substrate. Thereafter, the holes are filled with an insulating material to embed the dies into the substrate. Unfortunately, after said fabrication process is completed, the workability of the dies cannot be guaranteed. Moreover, there exists no chance of rework when the embedded dies and contacts are misaligned. Besides, given that the substrate is being warped, bumps on the dies may come off from the circuit layers, such that the dies cannot be operated in a normal manner.

SUMMARY OF THE INVENTION

The present invention is directed to a package structure with an embedded die and a method of fabricating the package structure, so as to resolve issues encountered by a conventional package structure having an embedded die.

The present invention provides a package structure with an embedded die. The package structure includes a core layer, a first build-up wiring structure, and a second build-up wiring structure. The core layer has a first surface and a second surface opposite to each other. Besides, the core layer includes a first dielectric layer, a leadframe, a die, a first signal layer, and a second signal layer. The die is disposed on and electrically connected to the leadframe, wherein the die and the leadframe are embedded in the first dielectric layer. The first signal layer is disposed on an upper surface of the first dielectric layer and electrically connected to the leadframe. By contrast, the second signal layer is disposed on a bottom surface of the first dielectric layer and electrically connected to the leadframe. The first build-up wiring structure is disposed on the first surface and is equipped with a second dielectric layer and a first surface circuit layer. The first surface circuit layer is electrically connected to the first signal layer. The second build-up wiring structure is disposed on the second surface and is equipped with a third dielectric layer and a second surface circuit layer. The second surface circuit layer is electrically connected to the second signal layer.

According to an embodiment of the present invention, the die is electrically connected to the leadframe through performing a wire-bonding technique, performing a flip-chip (F/C) bonding technique, using anisotropic conductive films (ACFs), performing an ultrasonic-wave bonding technique, or performing a through via or blind via connection technique.

According to an embodiment of the present invention, the core layer further includes a plurality of conductive vias disposed in the first dielectric layer, such that the leadframe is electrically connected to the first signal layer and the second signal layer.

According to an embodiment of the present invention, the package structure with the embedded die further includes a plurality of conductive vias passing through the second dielectric layer, such that the first signal layer is electrically connected to the first surface circuit layer through the conductive vias.

According to an embodiment of the present invention, the package structure with the embedded die further includes a plurality of conductive vias passing through the third dielectric layer, such that the second signal layer is electrically connected to the second surface circuit layer through the conductive vias.

According to an embodiment of the present invention, the package structure with the embedded die further includes a first solder mask disposed on the first surface circuit layer and exposing at least a portion of the first surface circuit layer.

According to an embodiment of the present invention, the package structure with the embedded die further includes a first oxidation-resistant layer disposed on at least the portion of the first surface circuit layer exposed by the first solder mask.

According to an embodiment of the present invention, the package structure with the embedded die further includes a plurality of solder balls or a plurality of ACFs disposed on the first oxidation-resistant layer, respectively.

According to an embodiment of the present invention, the package structure with the embedded die further includes a second solder mask disposed on the second surface circuit layer and exposing at least a portion of the second surface circuit layer.

According to an embodiment of the present invention, the package structure with the embedded die further includes a second oxidation-resistant layer disposed on at least the portion of the second surface circuit layer exposed by the second solder mask.

According to an embodiment of the present invention, the package structure with the embedded die further includes a plurality of solder balls or a plurality of ACFs disposed on the second oxidation-resistant layer, respectively.

The present invention further provides a method of fabricating a package structure with an embedded die. The method includes the following steps. First, a first resin coated copper, a second resin coated copper, a leadframe, and a die disposed on and electrically connected to the leadframe are provided. The first resin coated copper includes a first resin layer and a first copper foil disposed on the first resin layer, while the second resin coated copper includes a second resin layer and a second copper foil disposed on the second resin layer. Next, the first resin layer of the first resin coated copper and the second resin layer of the second resin coated copper are arranged to allow the first resin layer and the second resin layer respectively face an upper surface and a bottom surface of the leadframe. Meanwhile, the first resin coated copper, the second resin coated copper, and the leadframe are laminated for forming a core layer. Thereafter, the leadframe and the first copper foil are electrically conducted. The leadframe and the second copper foil are electrically conducted. The first copper foil and the second copper foil are also electrically conducted. After that, the first copper foil and the second copper foil are patterned to form a first signal layer and a second signal layer, respectively. Finally, a first build-up wiring structure and a second build-up wiring structure are formed on the first signal layer and the second signal layer, respectively. The first build-up wiring structure at least includes a first dielectric layer and a first surface circuit layer which is electrically connected to the first signal layer, while the second build-up wiring structure at least includes a second dielectric layer and a second surface circuit layer which is electrically connected to the second signal layer.

According to an embodiment of the present invention, the die is electrically connected to the leadframe through performing a wire-bonding technique or an F/C bonding technique.

According to an embodiment of the present invention, the steps of electrically conducting the leadframe and the first copper foil, the leadframe and the second copper foil, and the first copper foil and the second copper foil include forming a plurality of blind holes and at least a through hole in the first resin coated copper and the second resin coated copper and then filling the blind holes and the through hole with a metallic material, so as to form a plurality of conductive vias conducting the leadframe and the first copper foil, the leadframe and the second copper foil, and the first copper foil and the second copper foil.

According to an embodiment of the present invention, the method of fabricating the package structure with the embedded die further includes the following steps after the first build-up wiring structure and the second build-up wiring structure are completely formed. First, a first solder mask is formed on the first surface circuit layer, and a second solder mask is formed on the second surface circuit layer. The first solder mask exposes at least a portion of the first surface circuit layer, while the second solder mask exposes at least a portion of the second surface circuit layer. A first oxidation-resistant layer is then formed on at least the portion of the first surface circuit layer exposed by the first solder mask, and a second oxidation-resistant layer is formed on at least the portion of the second surface circuit layer exposed by the second solder mask.

According to an embodiment of the present invention, the method of forming the first oxidation-resistant layer and the second oxidation-resistant layer includes electroplating a nickel/gold alloy layer on at least the portion of the first surface circuit layer exposed by the first solder mask and on at least the portion of the second surface circuit layer exposed by the second solder mask, respectively.

According to an embodiment of the present invention, the method of fabricating the package structure with the embedded die further includes forming a plurality of solder balls on the first oxidation-resistant layer or on the second oxidation-resistant layer.

In the present invention, the die is first disposed on one leadframe, and then the entire leadframe is embedded into the substrate, so as to manufacture the package structure with the embedded die. Before the die and the leadframe are embedded into the substrate, an electrical inspection can be conducted on the die to ensure the workability of the die. In addition, it is likely to verify whether the die and the leadframe are misaligned. Given that the die is dislocated, the rework can be directly implemented to precisely relocate the die. After that, the entire leadframe is embedded into the substrate. Besides, the die is carried by the leadframe, so as to improve flexibility of the entire package structure. Thereby, the die and the leadframe are not electrically disconnected. Moreover, it is also likely to reduce the number of the circuit layers because the die is carried by the leadframe. As such, the cost of manufacturing the entire package structure can be reduced.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
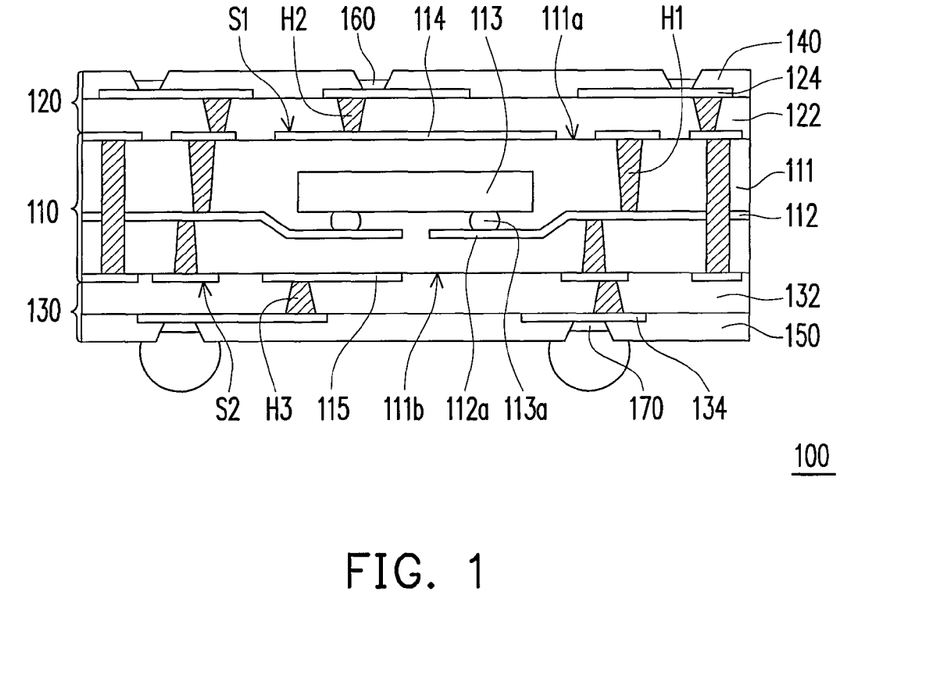
FIG. 1 is a schematic cross-sectional view of a package structure with an embedded die according to an embodiment of the present invention.

FIG. 1 is a schematic cross-sectional view of a package structure with an embedded die according to an embodiment of the present invention. Referring to FIG. 1, a package structure 100 with an embedded die is mainly constituted by a core layer 110, a first build-up wiring structure 120, and a second build-up wiring structure 130. Components of the package structure 100 with the embedded die and connecting correlations between the components will be described hereinafter with reference to the drawings.

The core layer 110 includes a first dielectric layer 111, a leadframe 112, a die 113, a first signal layer 114, and a second signal layer 115. Besides, the core layer 110 has a first surface S1 and a second surface S2 opposite to each other. The first dielectric layer 111 is composed of resin or other appropriate insulating materials. The leadframe 112 includes a plurality of inner leads 112a. In the present embodiment, the inner leads 112a of the leadframe 112 have a down-set design, such that the die 113 can be placed in concave portions of the inner leads 112a. However, any other type of the leadframe 112 can also be employed. The present invention poses no limitation on the type of the leadframe 112.

The die 113 is disposed on and electrically connected to the leadframe 112, and the die 113 and the leadframe 112 are embedded in the first dielectric layer 111. In the present embodiment, the die 113 is electrically connected to the inner leads 112a of the leadframe 112 through a plurality of bumps 113a disposed on a surface of the die 113. Alternatively, the die 113 can also be electrically connected to the leadframe 112 through performing a wire-bonding technique, performing an F/C bonding technique, using ACFs, performing an ultrasonic-wave bonding technique, performing a through via or blind via connection technique, or performing other appropriate techniques. The present invention does not restrict the technique by which the die 113 and the leadframe 112 are electrically connected. The first signal layer 114 is disposed on an upper surface 111a of the first dielectric layer 111 and electrically connected to the leadframe 112. By contrast, the second signal layer 115 is disposed on a bottom surface 111b of the first dielectric layer 111 and electrically connected to the leadframe 112. According to an embodiment of the present invention, the core layer 110 further includes a plurality of conductive vias H1 disposed in the first dielectric layer 111, such that the leadframe 112 is electrically connected to the first signal layer 114 and the second signal layer 115 through the conductive vias H1.

The first build-up wiring structure 120 is disposed on the first surface S1 of the core layer 110 and is equipped with a second dielectric layer 122 and a first surface circuit layer 124. The first surface circuit layer 124 is electrically connected to the first signal layer 114. The second build-up wiring structure 130 is disposed on the second surface S2 of the core layer 110 and is equipped with a third dielectric layer 132 and a second surface circuit layer 134. The second surface circuit layer 134 is electrically connected to the second signal layer 115. In an embodiment of the present invention, the package structure 100 further includes a plurality of conductive vias H2 and H3. The conductive vias H2 penetrate the second dielectric layer 122, such that the first signal layer 114 is electrically connected to the first surface circuit layer 124 through the conductive vias H2. The conductive vias H3 penetrate the third dielectric layer 132, such that the second signal layer 115 is electrically connected to the second surface circuit layer 134 through the conductive vias H3. As a matter of fact, the number of the dielectric layers, the circuit layers, and the conductive vias in the first build-up wiring structure 120 and the second build-up wiring structure 130 can be adjusted upon actual demands in other embodiments. The above descriptions are provided to demonstrate the basic components included in the package structure 100 with the embedded die.

Referring to FIG. 1, a first solder mask 140 and a second solder mask 150 can be further disposed respectively on the first surface circuit layer 124 and the second surface circuit layer 134 in the present invention. The first solder mask 140 merely exposes a portion of the first surface circuit layer 124. Likewise, the second solder mask 150 only exposes a portion of the second surface circuit layer 134. Thereby, the package structure 100 with the embedded die can be electrically connected to other electronic devices, such as chips, passive devices, and so forth.

On the other hand, a first oxidation-resistant layer 160 and a second oxidation-resistant layer 170 can be selectively disposed in the package structure 100 with the embedded die. The first oxidation-resistant layer 160 is disposed on the portion of the first surface circuit layer 124 exposed by the first solder mask 140, while the second oxidation-resistant layer 170 is disposed on the portion of the second surface circuit layer 134 exposed by the second solder mask 150. As such, the first surface circuit layer 124 and the second surface circuit layer 134 can be prevented from being oxidized due to the contact with air. In the present embodiment, the first oxidation-resistant layer 160 and the second oxidation-resistant layer 170 are made of a nickel/gold alloy layer, for example. It is likely to sequentially form the solder masks and the oxidation-resistant layers on the surface at one side of the package structure 100 based on different demands.

Moreover, as indicated in FIG. 1, solder balls can be selectively disposed on the second oxidation-resistant layer 170, such that the package structure 100 with the embedded die can be connected to a circuit board or other devices through the solder balls. It is also possible to electrically connect the package structure 100 to other devices through employing the ACFs or performing the ultrasonic-wave bonding technique. Similarly, the solder balls or the ACFs can be selectively disposed on the first oxidation-resistant layer 160, such that the package structure 100 with the embedded die can be electrically connected to the circuit board or other devices through the solder balls or the ACFs. The first oxidation-resistant layer 160 can also be electrically connected to other devices through the implementation of the wire-bonding technique or the ultrasonic-wave bonding technique.

FIGS. 2A to 2E are cross-sectional flowcharts showing a process of fabricating the package structure with the embedded die according to the present invention. The method of fabricating the package structure with the embedded die of the present invention will be elaborated hereinafter with reference to the drawings.

Figure 2A:
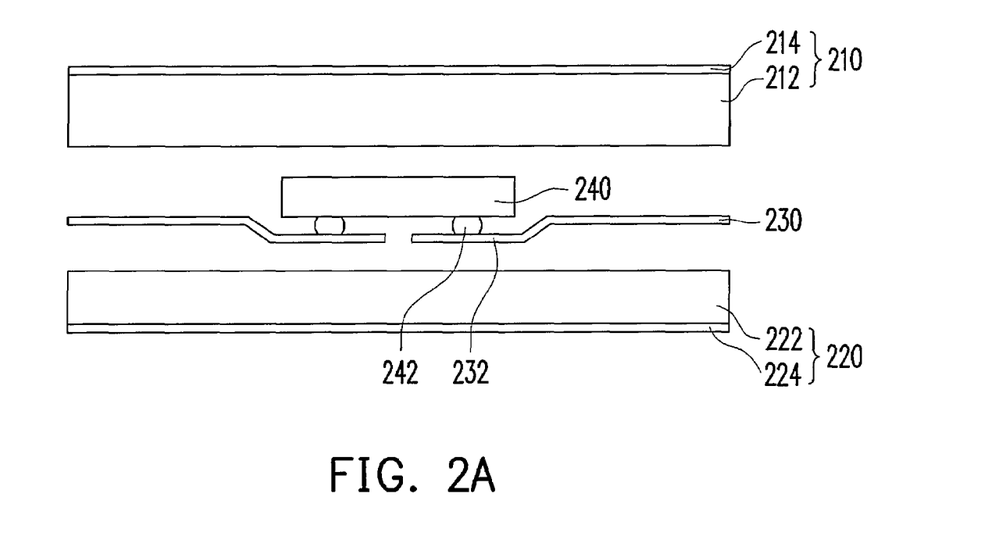
FIGS. 2A to 2E are cross-sectional flowcharts showing a process of fabricating the package structure with the embedded die according to the present invention.

First, referring to FIG. 2A, a first resin coated copper 210, a second resin coated copper 220, a leadframe 230, and a die 240 disposed on and electrically connected to the leadframe 230 are provided. As illustrated in FIG. 2A, the first resin coated copper 210 includes a first resin layer 212 and a first copper foil 214 positioned on the first resin layer 212. The second resin coated copper 220 includes a second resin layer 222 and a second copper foil 224 positioned on the second resin layer 222. In the present embodiment, the die 240 is electrically connected to inner leads 232 of the leadframe 230 through a plurality of bumps 242 disposed on a surface of the die 240. Nevertheless, the die 240 can also be electrically connected to the leadframe 230 through the implementation of the wire-bonding technique or other appropriate techniques. The present invention does not restrict the technique by which the die 240 and the leadframe 230 are electrically connected.

Figure 2B:
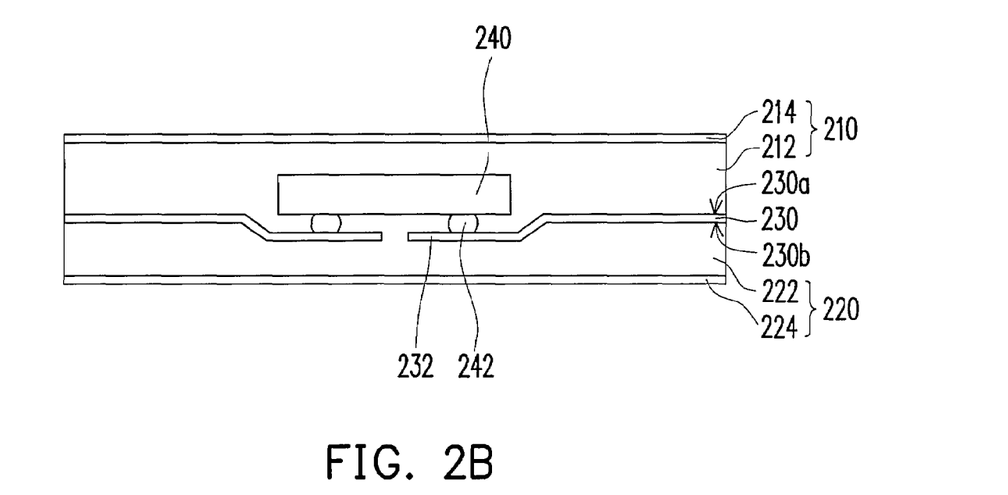
Figure 2C:
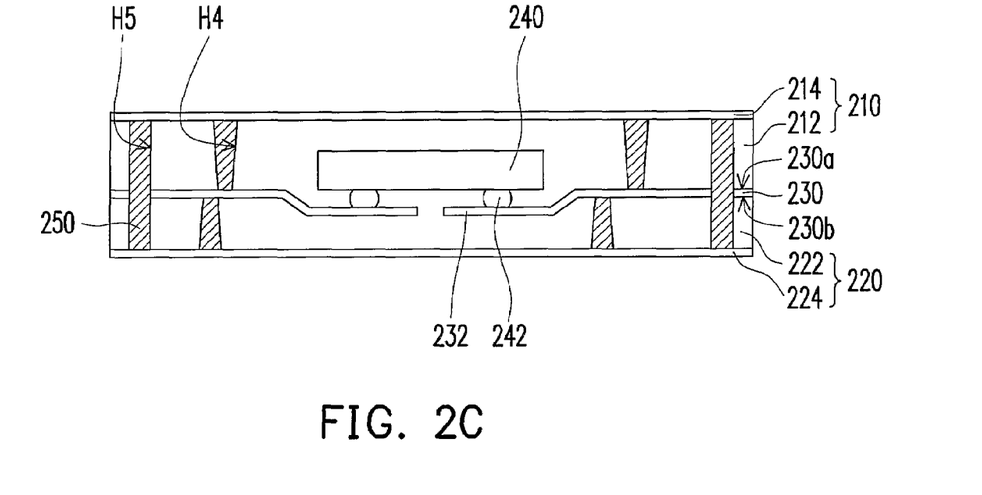

Next, referring to FIG. 2B, the first resin layer 212 of the first resin coated copper 210 and the second resin layer 222 of the second resin coated copper 220 are arranged to allow the first resin layer 212 and the second resin layer 222 respectively face an upper surface 230a and a bottom surface 230b of the leadframe 230. Meanwhile, the first resin coated copper 210, the second resin coated copper 220, and the leadframe 230 are laminated for forming a core layer. Thereafter, as shown in FIG. 2C, the leadframe 230 and the first copper foil 214 are electrically conducted. The leadframe 230 and the second copper foil 224 are electrically conducted. The first copper foil 214 and the second copper foil 224 are also electrically conducted. In one embodiment of the present invention, a plurality of blind holes H4 and at least a through hole H5 can be formed in the first resin coated copper 210 and the second resin coated copper 220. The blind holes H4 and the through hole H5 are then filled with a metallic material, so as to form a plurality of conductive vias 250 conducting the leadframe 230 and the first copper foil 214, the leadframe 230 and the second copper foil 224, and the first copper foil 214 and the second copper foil 224.

Figure 2D:
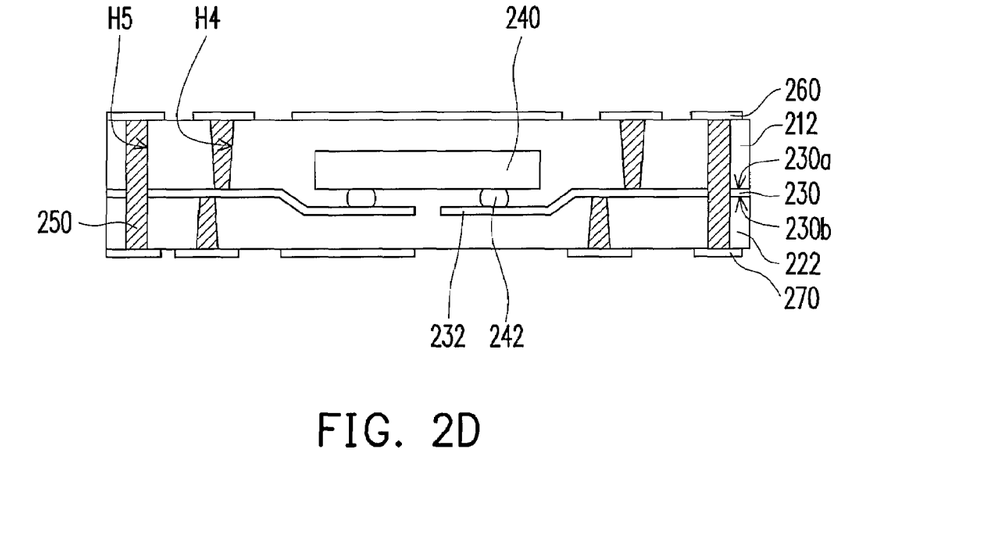
Figure 2E:
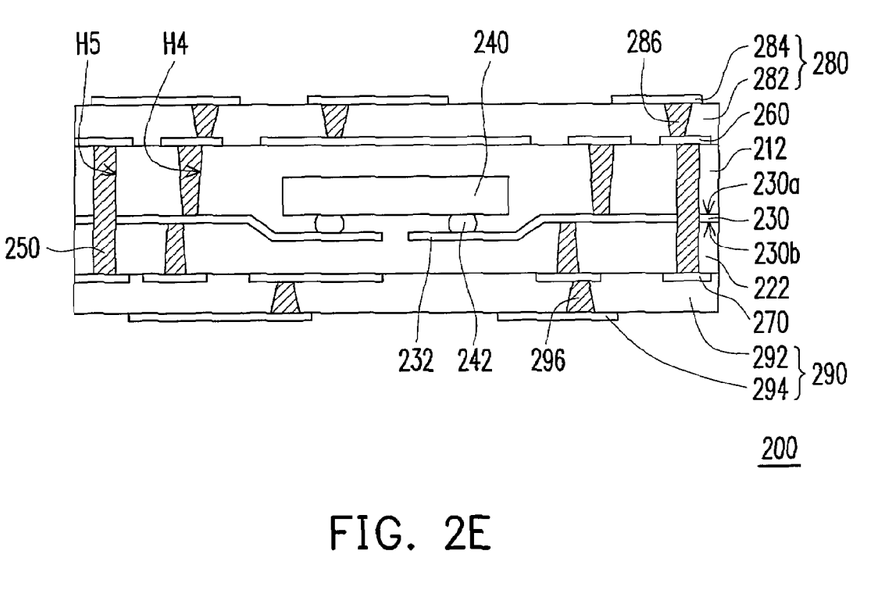

Afterwards, referring to FIG. 2D, the first copper foil 214 and the second copper foil 224 are patterned to form a first signal layer 260 and a second signal layer 270, respectively. Finally, as shown in FIG. 2E, a first build-up wiring structure 280 and a second build-up wiring structure 290 are respectively formed on the first signal layer 260 and the second signal layer 270. Up to here, the process of fabricating a package structure 200 with an embedded die is completed.

As indicated in FIG. 2E, the first build-up wiring structure 280 at least includes a first dielectric layer 282 and a first surface circuit layer 284 which is electrically connected to the first signal layer 260, while the second build-up wiring structure 290 at least includes a second dielectric layer 292 and a second surface circuit layer 294 which is electrically connected to the second signal layer 270. In the present embodiment, the first build-up wiring structure 280 is electrically connected to the first signal layer 260 through a plurality of conductive vias 286 disposed in the first dielectric layer 282. Likewise, the second build-up wiring structure 290 is electrically connected to the second signal layer 270 through a plurality of conductive vias 296 disposed in the second dielectric layer 292. In addition, as shown in FIG. 2E, the first build-up wiring structure 280 and the second build-up wiring structure 290 are exemplified by stacking one dielectric layer and one circuit layer together. However, the number of the dielectric layers, the circuit layers, and the conductive vias in the first build-up wiring structure 280 and the second build-up wiring structure 290 can be adjusted upon actual demands. The present invention poses no limitation on the number of said components.

Besides, after the fabrication of the package structure 200 with the embedded die is completed, the solder masks and the oxidation-resistant layers can be further formed on the surfaces at respective sides of the package structure 200 with the embedded die through conducting the method discussed hereinafter, so as to protect the circuit layers in the package structure 200 with the embedded die from damage or moisture.

Figure 3A:
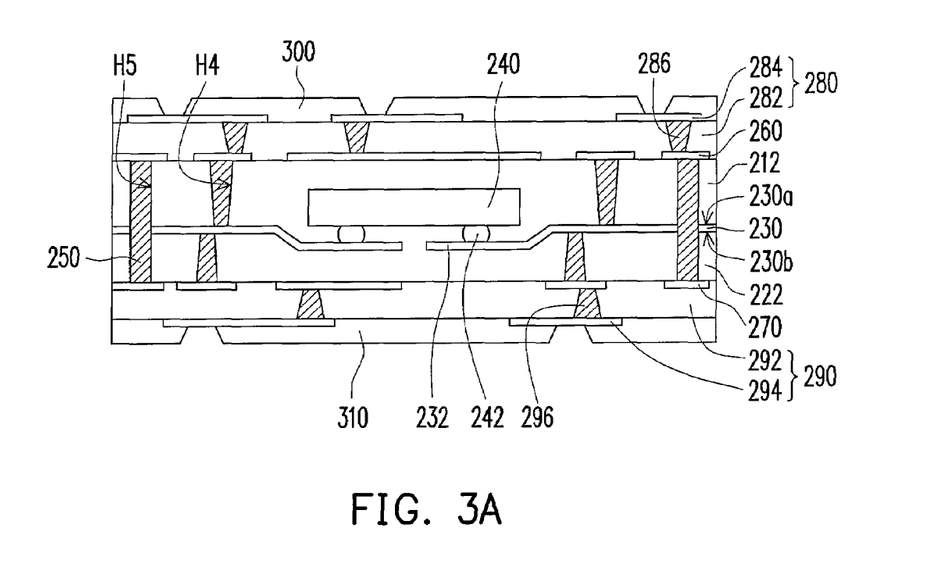
FIGS. 3A to 3C are cross-sectional flowcharts showing a process of forming solder masks and oxidation-resistant layers on surfaces at respective sides of the package structure with the embedded die.
Figure 3B:
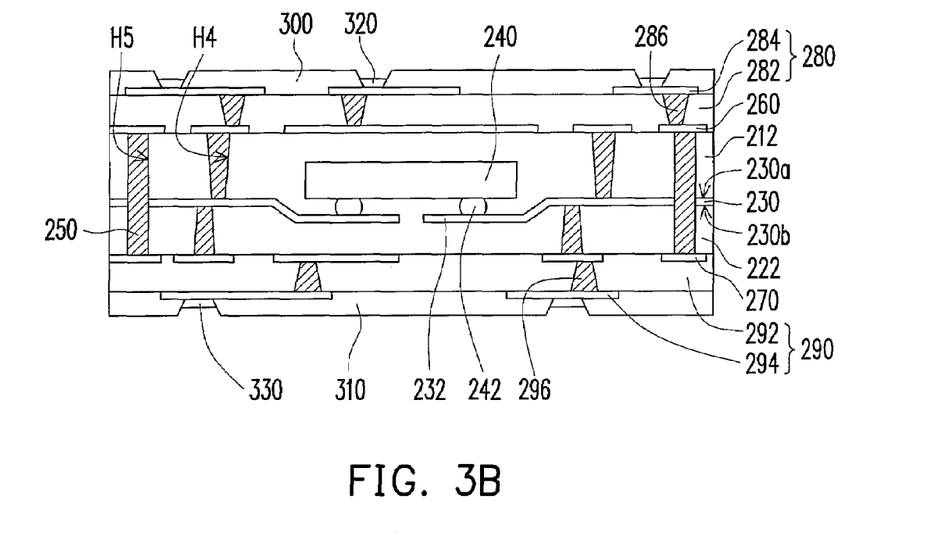
Figure 3C:
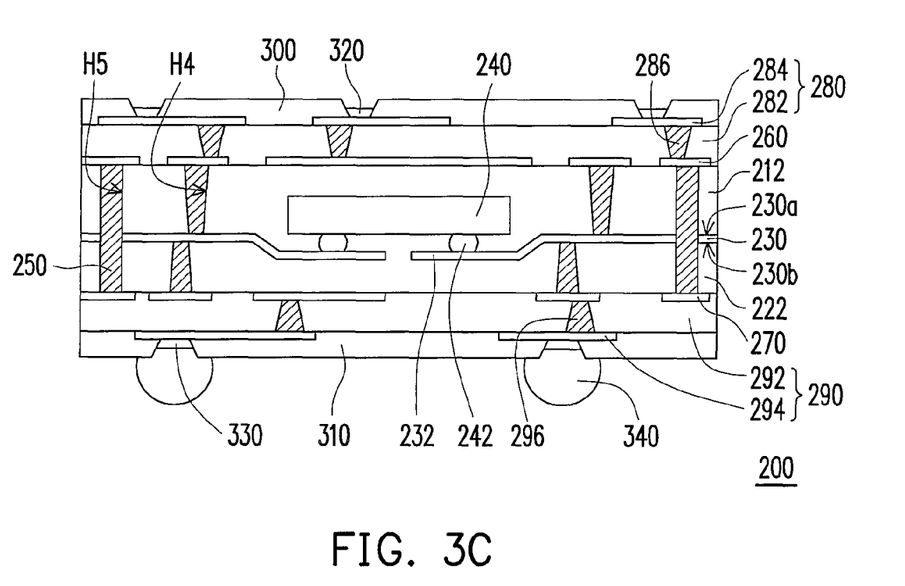

FIGS. 3A to 3C are cross-sectional flowcharts showing a process of forming the solder masks and the oxidation-resistant layers on the surfaces at the respective sides of the package structure with the embedded die. First, referring to FIG. 3A, a first solder mask 300 is formed on the first surface circuit layer 284 of the first build-up wiring structure 280, and a second solder mask 310 is formed on the second surface circuit layer 294 of the second built-up wiring structure 290. The first solder mask 300 exposes at least a portion of the first surface circuit layer 284, while the second solder mask 310 exposes at least a portion of the second surface circuit layer 294. Thereby, the package structure 200 with the embedded die can be electrically connected to other electronic devices, such as chips, passive devices, and so forth.

Next, as shown in FIG. 3B, a first oxidation-resistant layer 320 is formed on at least the portion of the first surface circuit layer 284 exposed by the first solder mask 300, while a second oxidation-resistant layer 330 is formed on at least the portion of the second surface circuit layer 294 exposed by the second solder mask 310. As such, the first surface circuit layer 284 and the second surface circuit layer 294 can be prevented from being oxidized due to the contact with air. In the present embodiment, the method of forming the first oxidation-resistant layer 320 and the second oxidation-resistant layer 330 includes electroplating a nickel/g old alloy layer on at least the portion of the first surface circuit layer 284 exposed by the first solder mask 300 and at least the portion of the second surface circuit layer 294 exposed by the second solder mask 310, for example, and thereby the first oxidation-resistant layer 320 and the second oxidation-resistant layer 330 are formed. It is also likely to sequentially form the solder masks and the oxidation-resistant layers on the surface at one side of the package structure 200 with the embedded die based on different demands.

Additionally, after the fabrication of the first solder mask 300, the second solder mask 310, the first oxidation-resistant layer 320, and the second oxidation-resistant layer 330 are completed, as illustrated in FIG. 3C, a plurality of solder balls 340 can be selectively formed on the first oxidation-resistant layer 320 or the second oxidation-resistant layer 330, such that the package structure 200 with the embedded die can be connected to the circuit board or other devices through the solder balls 340.

To sum up, the die of the present invention is first disposed on one leadframe, and then the entire leadframe is embedded into the substrate, so as to form the package structure with the embedded die. Before the leadframe is embedded into the substrate, an electrical inspection can be conducted on the die to ensure the workability of the die and to further improve yield of products. In addition, it is likely to verify whether the die and the leadframe are misaligned. Given that the die is dislocated, the rework can be directly implemented to precisely relocate the die. After that, the entire leadframe is embedded into the substrate. Moreover, the die is carried by the leadframe, so as to improve flexibility of the entire package structure. Thereby, the die and the leadframe are not electrically disconnected, and the reliability of the products can be guaranteed. Furthermore, it is also possible to reduce the number of the circuit layers because the die is carried by the leadframe, and thus the cost of manufacturing the entire package structure can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure with an embedded die, the package structure comprising:
   a core layer, having a first surface and a second surface opposite to each other, the core layer comprising:
   a first dielectric layer;
   a leadframe;
   a die, disposed on and electrically connected to the leadframe, wherein the die and the leadframe are embedded in the first dielectric layer;
   a first signal layer, disposed on an upper surface of the first dielectric layer and electrically connected to the leadframe; and
   a second signal layer, disposed on a bottom surface of the first dielectric layer and electrically connected to the leadframe;
   a first build-up wiring structure, disposed on the first surface, wherein the first build-up wiring structure has a second dielectric layer and a first surface circuit layer, and the first surface circuit layer is electrically connected to the first signal layer; and
   a second build-up wiring structure, disposed on the second surface, wherein the second build-up wiring structure has a third dielectric layer and a second surface circuit layer, and the second surface circuit layer is electrically connected to the second signal layer.

2. The package structure with the embedded die as claimed in claim 1, wherein the die is electrically connected to the leadframe through a wire-bonding technique, a flip-chip (F/C) bonding technique, anisotropic conductive films (ACFs), an ultrasonic-wave bonding technique, or a through via or blind via connection technique.

3. The package structure with the embedded die as claimed in claim 1, wherein the core layer further comprises a plurality of conductive vias disposed in the first dielectric layer, such that the leadframe is electrically connected to the first signal layer and the second signal layer through the conductive vias.

4. The package structure with the embedded die as claimed in claim 1, further comprising a plurality of conductive vias passing through the second dielectric layer, such that the first signal layer is electrically connected to the first surface circuit layer through the conductive vias.

5. The package structure with the embedded die as claimed in claim 1, further comprising a plurality of conductive vias passing through the third dielectric layer, such that the second signal layer is electrically connected to the second surface circuit layer through the conductive vias.

6. The package structure with the embedded die as claimed in claim 1, further comprising a first solder mask disposed on the first surface circuit layer and exposing at least a portion of the first surface circuit layer.

7. The package structure with the embedded die as claimed in claim 6, further comprising a first oxidation-resistant layer disposed on at least the portion of the first surface circuit layer exposed by the first solder mask.

8. The package structure with the embedded die as claimed in claim 7, further comprising a plurality of solder balls or a plurality of ACFs disposed on the first oxidation-resistant layer.

9. The package structure with the embedded die as claimed in claim 1, further comprising a second solder mask disposed on the second surface circuit layer and exposing at least a portion of the second surface circuit layer.

10. The package structure with the embedded die as claimed in claim 9, further comprising a second oxidation-resistant layer disposed on at least the portion of the second surface circuit layer exposed by the second solder mask.

11. The package structure with the embedded die as claimed in claim 10, further comprising a plurality of solder balls or a plurality of ACFs disposed on the second oxidation-resistant layer.

12. The package structure with the embedded die as claimed in claim 9, wherein the die is electrically connected to the leadframe through a wire-bonding technique, a flip-chip (F/C) bonding technique, anisotropic conductive films (ACFs), an ultrasonic-wave bonding technique, or a through via or blind via connection technique.

13. The package structure with the embedded die as claimed in claim 9, wherein the core layer further comprises a plurality of conductive vias disposed in the first dielectric layer, such that the leadframe is electrically connected to the first signal layer and the second signal layer through the conductive vias.

14. The package structure with the embedded die as claimed in claim 9, further comprising a plurality of conductive vias passing through the second dielectric layer, such that the first signal layer is electrically connected to the first surface circuit layer through the conductive vias.

15. The package structure with the embedded die as claimed in claim 9, further comprising a plurality of conductive vias passing through the third dielectric layer, such that the second signal layer is electrically connected to the second surface circuit layer through the conductive vias.

16. The package structure with the embedded die as claimed in claim 6, wherein the die is electrically connected to the leadframe through a wire-bonding technique, a flip-chip (F/C) bonding technique, anisotropic conductive films (ACFs), an ultrasonic-wave bonding technique, or a through via or blind via connection technique.

17. The package structure with the embedded die as claimed in claim 6, wherein the core layer further comprises a plurality of conductive vias disposed in the first dielectric layer, such that the leadframe is electrically connected to the first signal layer and the second signal layer through the conductive vias.

18. The package structure with the embedded die as claimed in claim 6, further comprising a plurality of conductive vias passing through the second dielectric layer, such that the first signal layer is electrically connected to the first surface circuit layer through the conductive vias.

19. The package structure with the embedded die as claimed in claim 6, further comprising a plurality of conductive vias passing through the third dielectric layer, such that the second signal layer is electrically connected to the second surface circuit layer through the conductive vias.

20. The package structure with the embedded die as claimed in claim 6, further comprising a second solder mask disposed on the second surface circuit layer and exposing at least a portion of the second surface circuit layer.

* * * * *